US012631886B2

(12) United States Patent
Rushford et al.

(10) Patent No.: US 12,631,886 B2
(45) Date of Patent: May 19, 2026

(54) TRANSMISSION GRATING BEAM COMBINER

(71) Applicant: Lawrence Livermore National Security, LLC, Livermore, CA (US)

(72) Inventors: Michael Rushford, Livermore, CA (US); Hoang T. Nguyen, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 511 days.

(21) Appl. No.: 17/650,615

(22) Filed: Feb. 10, 2022

(65) Prior Publication Data

US 2022/0260843 A1 Aug. 18, 2022

Related U.S. Application Data

(60) Provisional application No. 63/171,509, filed on Apr. 6, 2021, provisional application No. 63/149,014, filed on Feb. 12, 2021.

(51) Int. Cl.
| | |
|---|---|
| *H01S 3/30* | (2006.01) |
| *G02B 5/18* | (2006.01) |
| *G02B 6/293* | (2006.01) |
| *G02B 27/10* | (2006.01) |
| *H01S 5/40* | (2006.01) |

(52) U.S. Cl.
CPC ....... *G02B 27/1086* (2013.01); *G02B 5/1866* (2013.01); *G02B 6/29311* (2013.01); *H01S 5/4012* (2013.01)

(58) Field of Classification Search
CPC .............. G02B 27/1086; G02B 5/1866; G02B 6/29311; H01S 5/4012
USPC ................................ 359/569, 576; 372/32, 3
See application file for complete search history.

(56) References Cited

U.S. PATENT DOCUMENTS

| | | | | | |
|---|---|---|---|---|---|
| 5,101,458 | A | * | 3/1992 | Spaulding .............. | G02B 6/124 |
| | | | | | 385/36 |
| 5,537,252 | A | * | 7/1996 | Rauch ................ | G02B 27/1073 |
| | | | | | 359/569 |
| 5,907,436 | A | * | 5/1999 | Perry ................... | G03H 1/0252 |
| | | | | | 359/569 |

(Continued)

OTHER PUBLICATIONS

Clausnitzer et al., "Investigation of the polarization-dependent diffraction of deep dielectric rectangular transmission gratings illuminated in Littrow mounting," Appl. Opt., vol. 46, No. 6, pp. 819-826 (2007).
Clausnitzer et al., "Highly-dispersive dielectric transmission gratings with 100% diffraction efficiency," Opt. Express, vol. 16, No. 8, pp. 5577-5584 (2008).
Marciante et al., "Polarization-insensitive high-dispersion total internal reflection diffraction gratings," J. Opt. Soc. Am. A, vol. 22, No. 2, pp. 299-305 (2005).

(Continued)

*Primary Examiner* — Audrey Y Chang
(74) *Attorney, Agent, or Firm* — Knobbe, Martens, Olson & Bear, LLP

(57) ABSTRACT

A transmission grating optical beam combiner is provided. In some implementations, the beam combiner can include an optically transparent substrate and a transmission grating on the substrate. The transmission grating can be configured to combine and/or superimpose first and second input beams as a single output beam. The first input beam can be incident on the transmission grating at an angle corresponding to one diffraction order of the grating and the second input beam can be incident on the transmission grating at an angle corresponding to another diffraction order of the grating.

20 Claims, 5 Drawing Sheets

(56) References Cited

U.S. PATENT DOCUMENTS

| | | | | |
|---|---|---|---|---|
| 8,094,689 | B1* | 1/2012 | Koplow | H01S 3/094096 |
| | | | | 372/3 |
| 2002/0045104 | A1* | 4/2002 | Efimov | G03H 1/0248 |
| | | | | 430/1 |
| 2006/0109876 | A1* | 5/2006 | Donoghue | G02B 27/1086 |
| | | | | 372/102 |
| 2006/0268408 | A1* | 11/2006 | Toussaint | G02B 27/286 |
| | | | | 359/489.09 |
| 2009/0296229 | A1* | 12/2009 | Towner | G02B 26/108 |
| | | | | 359/831 |
| 2012/0012762 | A1* | 1/2012 | Nowak | G02B 27/1006 |
| | | | | 359/333 |
| 2012/0120390 | A1* | 5/2012 | Fattal | G01B 11/26 |
| | | | | 356/121 |
| 2017/0182597 | A1* | 6/2017 | Abdou-Ahmed | G02B 5/1861 |
| 2017/0235151 | A1* | 8/2017 | Kim | G02B 27/106 |
| | | | | 359/572 |
| 2020/0096684 | A1 | 3/2020 | Nguyen | |
| 2020/0174265 | A1 | 6/2020 | Nguyen et al. | |
| 2021/0263201 | A1 | 8/2021 | Nguyen | |

OTHER PUBLICATIONS

Nagashima et al., "Improvement of diffraction efficiency of dielectric transmission gratings using anti-reflection coatings," Optics Express, vol. 21, No. 16, pp. 18640-18645 (2013).

Neviére et al., "Perfect blazing for transmission gratings," J. Opt. Soc. Am. A, vol. 7, No. 9, pp. 1736-1739 (1990).

Nguyen et al., "High-efficiency fused-silica transmission gratings," Opt. Lett., vol. 22, No. 3, pp. 142-144 (1997).

Perry et al., "High-efficiency multilayer dielectric diffraction gratings," Opt. Lett., vol. 20, No. 8, pp. 940-942 (1995).

Rasmussen, T., "Why are transmission gratings less angle sensitive than reflection gratings?" Technical Note—Transmission grating angle sensitivity, Ibsen Photonics A/S, Publication Version: Nov. 12, 2013, pp. 1-3.

Roumiguieres et al., "On the efficiencies of rectangular-groove gratings," J. Opt. Soc. Am., vol. 66, No. 8, pp. 772-775 (1976).

* cited by examiner

200

PROVIDE TRANSMISSION GRATING          210

PROVIDE A FIRST BEAM INCIDENT ON THE TRANSMISSION GRATING SO AS TO DIFFRACT THE FIRST BEAM INTO ONE DIFFRACTION ORDER          220

PROVIDE A SECOND BEAM INCIDENT ON THE TRANSMISSION GRATING SO AS TO DIFFRACT THE SECOND BEAM INTO ANOTHER DIFFRACTION ORDER          230

COMBINE VIA THE TRANSMISSION GRATING THE FIRST AND SECOND BEAMS AS AN OUTPUT BEAM          240

TRANSMISSION GRATING BEAM COMBINER

CROSS-REFERENCE TO RELATED APPLICATIONS

This application claims the benefit of priority to U.S. Provisional Application No. 63/149,014, entitled "CASCADED TRANSMISSION GRATING BEAM COMBINER," filed Feb. 12, 2021 and to U.S. Provisional Application No. 63/171,509, entitled "TRANSMISSION GRATING BEAM COMBINER," filed Apr. 6, 2021. The entirety of each application referenced in this paragraph is incorporated herein by reference.

FEDERALLY SPONSORED RESEARCH OR DEVELOPMENT

This invention was made with Government support under Contract No. DE-AC52-07NA27344 awarded by the United States Department of Energy. The Government has certain rights in the invention.

BACKGROUND

Field

The present disclosure relates generally to optical beam combining, and more specifically to transmission grating optical beam combining devices, systems, and methods.

Description of the Related Art

Crystal gain media like yttrium lithium fluoride (YLF) and yttrium aluminum garnet (YAG) have a narrow gain spectral bandwidth. Optical beam amplifiers can utilize many stages of gain in order make the beam entering the subsequent amplifier able to extract the stored energy. If individual commercial lasers could be combined into a single more energetic "seed" beam, then extracting energy from fewer amplifiers could be achieved, improving or optimizing SWaP (size, weight, power) and producing a simpler system configuration for serviceability.

It is possible to produce high peak and average powers from fiber lasers with output exceeding 150 kilowatts using spectral beam combining techniques. Spectral beam combining also called wavelength beam combining or simply wavelength combining can refer to a class of techniques within the more general area of power scaling by beam combining. The goal in many cases is to combine pluralities of high-power laser beams so as to obtain a single beam not only with correspondingly higher power but also with more or less preserved beam quality and thus with increased brightness. The general principle of spectral beam combining is to have several beams with non-overlapping optical spectra (e.g., different wavelengths) and combine them with a wavelength-sensitive beam combiner. Examples of such combiners are prisms and diffraction gratings, which can deflect incident beams according to their wavelengths so that subsequently these beams propagate in the same direction. Spectra beam combining can combine laser beams of different wavelengths.

While combining same wavelength and large spectral widths beams into one colinear, overlapped beam can be performed with dielectric layered beam splitters with ~90+% efficiency for two orthogonal linear polarizations, these coatings typically have damage threshold limits. And no additional beam can thereafter be combined.

SUMMARY

The present disclosure relates generally to methods and apparatus of combining the outputs of a plurality of lasers into a single beam potentially of excellent beam quality. Specifically, various implementations can permit the combining beams of the same wavelength lasers possibly with extremely narrow linewidths (picometer) or even broad linewidths (nanometers) and beams of lasers with either the same polarization or random polarization into a single superimposed and/or colinear (e.g., substantially colinear) output. Some implementations can allow the combining of different wavelengths. As an example, methods and devices described herein can be employed with crystal gain media like YLF and YAG having a polarized narrow gain spectral bandwidth or with high power, broad linewidth fiber lasers with random polarization. Other lasers or light sources, however, may be employed.

Additionally, the present disclosure is directed to a transmission grating optical beam combiner and combining method which uses transmission gratings in a non-Littrow orientation (where the incident angle and the diffractive angle are not equal as with various spectral beam combining techniques). In some implementations, the transmission grating and/or the system that includes the grating is configured to have only +1 and −1 diffraction orders to produce high efficiency. Two optical beams, which may be monochromatic and/or have same or different wavelengths, can be incident on the transmission grating and diffract into opposite diffraction orders output from the grating. Both beams can be diffracted normal to the grating to combine into a single superimposed output, e.g., a single colinear output. High diffraction efficiency can be achieved in the non-Littrow orientation by configuring (e.g., optimizing in some instances) the transmission grating line density, grating profile height and/or width, effective optical index, or any combination of these simultaneously.

In some instances, a plurality of optical beams (e.g., lasers) may be combined by a transmission grating formed, for example, as part of an all bulk substrate (e.g., a monolithic structure). In some implementations, the grating may be formed in the bulk substrate, e.g., by patterning or etching. In some implementations, the grating may be formed in a layer on the substrate, e.g., by patterning or etching. In some implementations, the grating may be formed both in a layer on the substrate and in the substrate. In some implementations, the device may include a dielectric coating such as in a multilayer dielectric stack, for example, beneath the grating. In some configurations, the device can be configured to be at least 90%, 95%, 99%+ efficient at the combining of the beams.

In various implementations, the transmission grating can be an all bulk structure fabricated in fused silica, silicon, diamond, silicon nitride, etc. having a high damage threshold.

In some implementations, the transmission grating can also have a dielectric coating, which may potentially increase diffraction efficiency and optical bandwidth.

And in another example embodiment, two or more gratings (each combining two beams) may be arranged in a cascading or branching arrangement with two or more levels where beam combining occurs, so that the number of beams capable of being combined grows, e.g., exponentially. In some implementations, at every level of the cascaded arrangement, the gratings can be at least 90%, 95%, or 99%+ efficient at the combining of each pair of beams.

Also, it is notable that when two laser beams of the same wavelength are overlapped to be superimposed and/or colinear, there may be amplitude modulation (AM) interference for continuous wave (CW) and long pulses (both more often very narrow spectrum) overlapped in time. Coherent phasing controls may be used in some >0.9 Strehl requirements. If pulses are staggered in time, no AM interference may result. This is a useful opportunity to have different pulse amplitudes progressively larger for the last pulse in some amplifier and system use requirements.

The present disclosure may be used in industrial beam combining and any other application where combining same or different wavelength beams can provide system performance advantages. Combining may be motivated by each laser itself, which may have its own internal beam irradiance limitations. For example, each beam's parameters may depart from ideal and lower the overall performance of the beam combining system.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
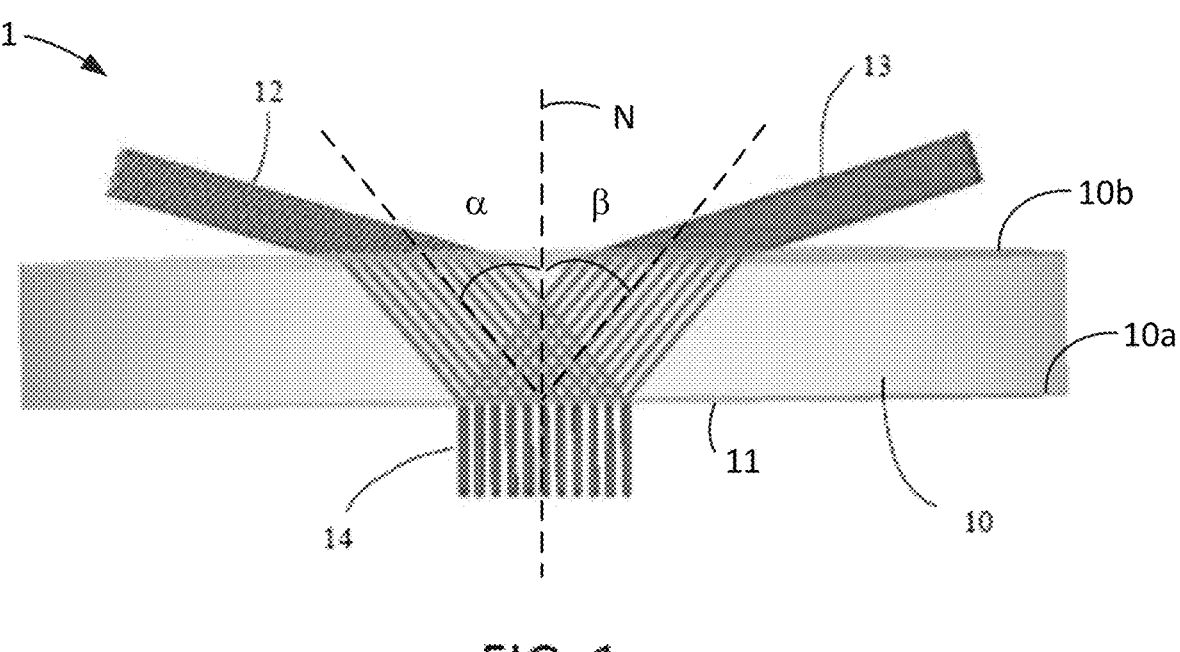
FIG. 1 is a schematic view of an example of the transmission grating beam combiner showing two beams being combined.

Turning to the drawings, FIG. 1 shows an example embodiment of the transmission grating beam combiner of the present disclosure showing two beams being combined. In particular, in this example, the combiner 1 is shown as a unitary optical element comprising an optically transparent substrate 10 and a transmission grating 11 formed on a surface 10*a* of the substrate 10. The grating 11 may, for example, be patterned (e.g., etched) into the substrate 10. Alternatively, the grating 11 may be formed in one or more layers on the substrate 10 (and may potentially extend into the substrate 10). The transmission grating beam combiner 1 can be configured to combine first and second input beams, superimposing the two beams into a single output beam. For example, in FIG. 1, two input beams 12 and 13 are shown entering the combiner 1 through the substrate 10 where they are incident on the grating 11 and exit as combined beam 14. In the example shown in FIG. 1, the grating 11 may be on the forward surface 10*a* (e.g., bottom surface as shown) of the substrate 10. The first and second beams 12, 13 may be incident on the rearward surface 10*b* (e.g., top surface as shown) of the substrate 10. The first and second beams 12, 13 may be refracted at the rearward surface 10*b*. The beams 12, 13 may be positioned so as to overlap (after being refracted and propagating through the thickness of the substrate 10) and being incident on the grating 11. The grating 11 may be configured to diffract the beams 12, 13 redirecting the beams normal to the grating 11, the forward surface 10*a*, and/or the rearward surface 10*b* of the substrate 10 in this case. More generally, the grating 11 may be configured to diffract the first and second beams 12, 13 such that the beams propagate along the same direction. As referenced above, these beams may be superimposed or overlapped. For example, in some designs, at least 85%, 90%, 95%, 97%, 98%, 99%, 99.5%, 99.8%, 99.9%, 99.99%, 99.999%, or 100% of the beams may be superimposed or overlapped. In some implementations, the overlap may be in any range formed by any of these percentages such as from 90% to 100% or less than 100% but at least 85% or other ranges as well. In some cases, the beams 12, 13 at the output of the grating 11 may be colinear (e.g., substantially colinear). Accordingly, the beams may be directed in the same angle. In some instances, system design tolerance may allow some offsets such as positioning offsets or misalignments, e.g., depending on the overall system design.

Figure 2:
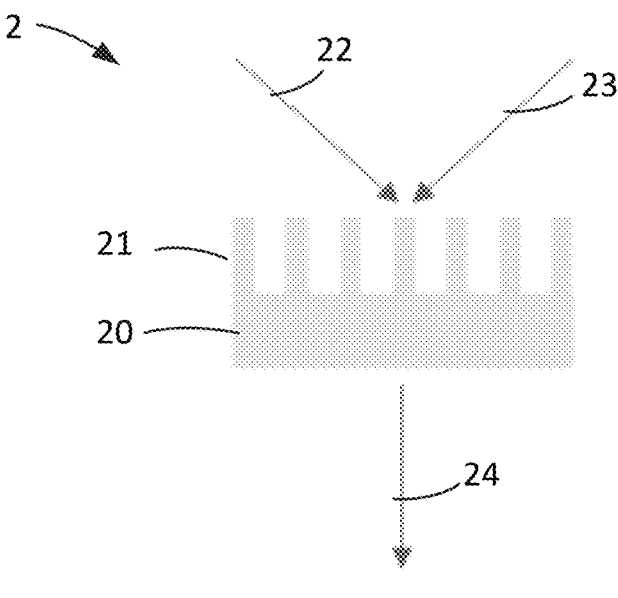
FIG. 2 is a schematic view of another example of the transmission grating beam combiner showing two input beams being combined by a grating formed on an optically transparent substrate as part of an all bulk substrate optical element.
Figure 3:
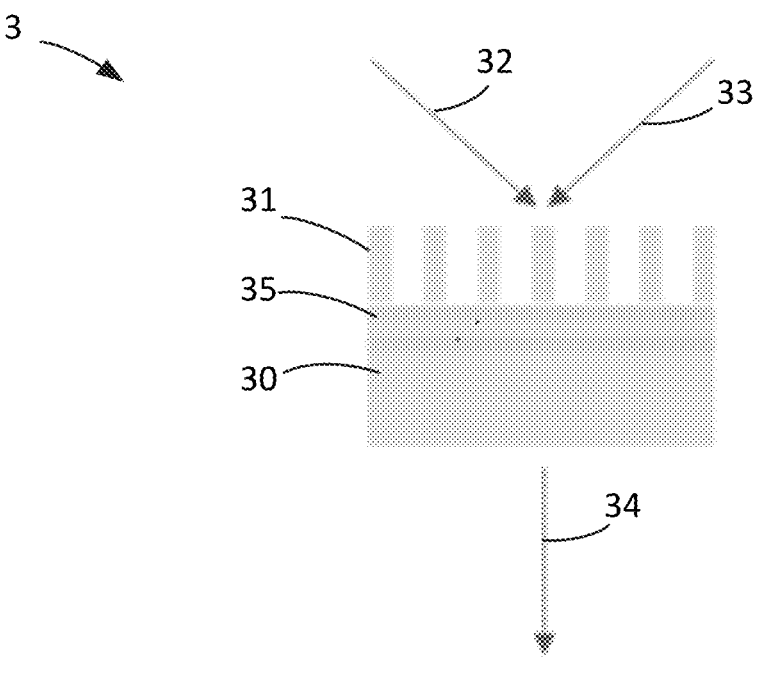
FIG. 3 is a schematic view of another example of the transmission grating beam combiner showing two input beams being combined by a grating having a dielectric thin film stack.
Figure 4:
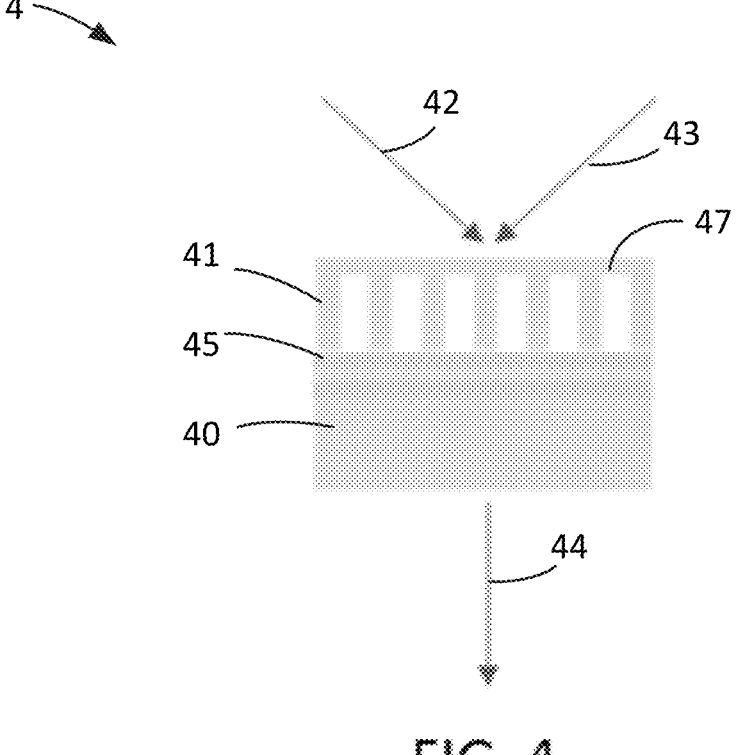
FIG. 4 is a schematic view of another example of the transmission grating beam combiner, similar to FIG. 3, but having an encapsulated grating to further increase the laser damage threshold and reliability.

In some others examples (e.g., as shown in FIGS. 2-4), instead of the grating 11 being on the forward surface 10*a* of the substrate as shown in FIG. 1, the grating 11 may be on the rearward surface 10*b* of the substrate 10 (e.g., top surface as shown in FIG. 1). In some such designs, the input beams 12, 13 may enter the combiner 1 through the grating 11 where they are combined in the substrate 10 and exit as combined beam 14.

In some instances, the first and second input beams 12, 13 can be provided by lasers outputting light of the same wavelength(s). The first input beam 12 may have a first wavelength distribution and the second input beam 13 may have a second wavelength distribution. In some implementations, the first and second wavelength distributions overlap. For example, in some implementations, the overlap between the first and second wavelength distributions is at least 50%, 60%, 70%, 80%, 85%, 90%, 95%, 97%, 98%, 99%, 99.5%, 99.6%, 99.7%, 99.8%, 99.9%, 99.99%, 99.999%, or 100% of the size of the first wavelength distribution (and/or the second wavelength distribution). The overlap may be in any range formed by any of these percentages in some implementations such as from 90% to 100% or less than 100% but at least 85%. In various instances, the first and second wavelength distributions are the same (e.g., substantially the same). In some implementations, the first wavelength distribution, the second wavelength distribution, and the wavelength distribution of the output beam 14 can overlap. In some implementations, the first wavelength distribution, the second wavelength distribution, and the wavelength distribution of the output beam 14 can be the same (e.g., substantially the same). In some instances, the first and second input beams 12, 13 can be provided by lasers outputting light of different wavelengths. For example, the first and second input beams 12, 13 can have different spectral distributions. The combined beam 14 can have a combined spectral distribution.

The first and second input beams 12, 13 can have narrow linewidths to broad linewidths. For example, the first and second input beams 12, 13 can have spectral distributions with a full width at half-maximum (FWHM) of 20 nm, 17 nm, 15 nm, 12 nm, 10 nm, 5 nm, 3 nm, 1 nm or less (or any ranges formed by any of such values). As another example, the first and second input beams 12, 13 can have spectral distributions with a FWHM of 10 pm, 7 pm, 5 pm, 4 pm, 3 pm, 2 pm, 1 pm, 0.5 pm or less (or any ranges formed by any of such values). As another example, the first and second input beams 12, 13 can have linewidths of 1000 GHz, 750 GHz, 500 GHz, 250 GHz, 100 GHz, 50 GHz, 25 GHz, 10 GHz, 5 GHz, 1 GHz or less (or any ranges formed by any of such values). In some implementations, the wavelength distribution of the first and/or second beams 12, 13 may be narrow band and may be monochromatic. In some designs, the first and second input beams 12, 13 can have a wavelength range from 1 to 2 microns (e.g., where materials having low absorption for those wavelengths are available). In some instances, the first and second input beams 12, 13 can have the same polarization. In some instances, the first and second input beams 12, 13 can have different polarizations. In some implementations, the first and/or second input beams may be polarized. In some implementations, the first and/or second implementations may be unpolarized. In some instances, the first and second input beams 12, 13 can have random polarization.

As shown in FIG. 1, the first input beam 12 can be incident on the transmission grating 11 at a first angle $\alpha$ and the second input beam 13 can be incident on the transmission grating 11 at a second angle $\beta$ (e.g., measured with respect to the normal N to the transmission grating 11). The first input beam 12 can be incident on the transmission grating 11 on one side of the normal N to the transmission grating 11, and the second input beam 13 can be incident on the transmission grating 11 on the other side of the normal N to the transmission grating 11. The first and second input beams 12, 13 can thus be on opposite sides of the normal N to the transmission grating 11. As discussed above, the configuration is not a Littrow configuration. In this non-Littrow configuration, the magnitude of the angle of incidence of the input beam does not equal the magnitude of the angle of the output beam. For example, the magnitude of the input angles are non-zero values shown as $\alpha$ and $\beta$, while the output angle is 0 degrees as measured with respect to the normal N of the grating 11 (or 90 degrees as measured with respect to the grating 11). Accordingly, in various implementations, the transmission grating 11 can output the combined beam 14 at an angle not equal to the first incident angle $\alpha$ or the second incident angle $\beta$ (e.g., in a non-Littrow configuration). In FIG. 1, the transmission grating 11 can output the combined beam 14 at an angle normal to the transmission grating 11.

The design of the transmission grating 11 can depend at least in part on parameters of the transmission grating 11. These parameters may include line density, grating profile height, grating profile width, effective optical index or any combination of these. Other features of the grating may also be adjusted accordingly. In some such examples, the grating period can be selected for a given wavelength (e.g., selected to be no larger than the given wavelength). In some implementations, the transmission grating 11 can be designed such that an input beam incident at the first angle $\alpha$ can diffract into one of the diffraction orders of the grating and an input beam incident at the second angle $\theta$ can diffract into another of the diffraction orders of the grating such that the two beams are directed in the same direction. In various designs, the transmission grating 11 and/or combiner can be configured to exclude, suppress, reduce, or minimize the amount of light in other diffraction orders (e.g. the amount of light in the other orders can be 8% or less of the amount of light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of these values). In some implementations, for example, the two diffractive orders forming the combined beam may be, for example, the m=+1 and m=−1 (or m=+2 and m=−2, or m=+3 and m=−3, etc.) diffractive orders, respectively, of the diffraction grating 11. As is well known, m is an integer corresponding to the order for diffraction. For example, as is well known, in some cases a diffraction grating can be characterized by a diffraction equation, m$\lambda$=2d(sin $\theta_i$+sin $\theta_o$), where m is the order of diffraction, d is the distance between diffractive features, $\lambda$ is the wavelength, $\theta_i$ is the angle of incidence, $\theta_o$ is the angle of diffraction. Other equations, mathematical or scientific models, etc., can be used, however, to characterize the diffraction and thus the order, m, need not be limited to the particular equation recited above. In some cases, the m=+1 and m=−1 orders are said to correspond to the first order of diffraction, first diffractive order or first diffraction order, for example; m=+2 and m=−2 are said to correspond to the second order of diffraction, second diffractive order or second diffraction order; m=+3 and m=−3 are said to correspond to the third order of diffraction, third diffractive order, third diffraction order; m=+4 and m=−4 are said to correspond to the fourth order of diffraction, fourth diffractive order, fourth diffraction order, and so on. The angles of the input beams 12, 13 may be selected so as to diffract into the two respective diffraction orders, for example, m=+1 and m=−1 (or m=+2 and m=−2 or m=+3 and m=−3, etc.) diffractive orders of the diffraction grating 11. In some implementations, the two orders have the same order number, e.g. m=1 or m=2. Additionally, in various implementations, the two orders have opposite signs (e.g., plus and minus diffraction orders). In certain implementations where the wavelengths of the two input beams are the same and one of the input beams is incident at a first angle $\alpha$ and the other input beam is incident at an angle $\beta$ where $\alpha$ and $\beta$ have the same magnitude and opposite signs (e.g., $\alpha$=−$\beta$), there exist values of $\alpha$ and $\beta$ where the input beams can couple into diffraction orders having the same order number but opposite signs such that the diffracted beams have the same direction, for example, normal to the grating. Thus, in some instances, the two diffraction orders can comprise opposite diffraction orders, for example, such that both input beams 12, 13 diffract into the same direction such as normal to the transmission grating 11. In certain implementations where the input beams are not of the same wavelength, there may still exist angles $\alpha$ and $\beta$ of the input beams that produce diffracted beams directed in the same direction, e.g., normal to the grating. In some implementations, the magnitude of the input angles may not be the same but the sign may again be opposite.

Likewise, as illustrated, the input beams 12, 13 may be on opposite sides of the output beam 14 or a normal to the grating 11 or substrate 10 passing through the center of the output beam 14. In various designs, the output beam 14 can exit along a path that is at an angle with respect to the normal N to the grating 11 that is between the angles α, β of the first and second input beams 12, 13. For example, if α and β are −45 degrees and +45 degrees respectively, the output beam 14 can exit at an angle between −45 degrees and +45 degrees with respect to the normal N to the grating 11 (e.g., 0 degrees in FIG. 1). In some designs, the output beam 14 can exit along a path that is more normal to the grating 11 than the first and second input beams 12, 13. Additionally, in some implementations the input beams 12, 13 may be arranged symmetrically on opposite sides of the output beam 14 such that the output beam 14 exits along a path that is at an angle with respect to the normal N to the grating 11 that bisects the angles α, β of the first and second input beams 12, 13. In some instances, the input beams 12, 13 may be arranged symmetrically on opposite sides of a normal N to the grating 11 or substrate 10 passing through the center of the output beam 14. For example, the magnitude of the angles α and β may be the same or about the same (e.g., equal or about equal in magnitude and opposite in sign). Other examples are possible. In some implementations, the first one of the diffraction orders and the second one of the diffraction orders may be any combination of m=+1, +2, +3, etc. and −1, −2, −3, etc. For example, the angles of the input beams 12, 13 may be selected so as to diffract into and/or correspond to the two orders m=+1 and m=−2; or the two orders m=+1 and m=−3; or the two orders m=+2 and m=−1; or the two orders m=+2 and m=−3; etc. diffractive orders of the diffraction grating 11. In various designs, to increase efficiency of the combiner, the transmission grating 11 and/or combiner can be configured to exclude, suppress, reduce, or minimize the amount of light diffracted into other diffraction orders. For example, negligible amounts of light may be diffracted into other modes, such as reflective diffraction modes m=1 or higher or transmissive diffraction modes m=1 or higher other than the mode into which the light is to be diffracted into to form the combined beam. Additionally, the amount of undiffracted reflected or transmitted light (e.g., the zeroth order reflection or transmission mode modes) can be 8% or less of the amount of light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of these values.

Accordingly, the light may be output from the transmissive grating along a common beam direction, different than the input beams, e.g., normal to the grating and not the m=±0 transmission modes (e.g., a non-Littrow configuration). As discussed above, light from both the first and second input beams 12, 13 and may be diffracted while the undiffracted transmitted light, the m=0 transmission mode is reduced, minimized, and/or suppressed. In some implementations, for example, the output corresponds to a beam that is normal to the diffraction grating. The parameters of the diffraction grating 11, for example, line density, grating profile height, grating profile width, effective optical index or any combination of these, as well as possibly other characteristics of the grating, can be such so at to provide for coupling light from the first and second input beams 12, 13 into one or more, such as two respective output diffractive modes (e.g., m=+1, −1 orders) having a different angle than the angle of incidence (e.g., m≠0 order such as m=+1, −1 orders) and thus be a non-Littrow configuration. In various implementations, the diffraction grating 11 and/or combiner can be configured to exclude, suppress, reduce, or minimize other diffraction modes. Excluding, suppressing, reducing, or minimizing other modes besides the specific modes coupled into the output beam in the common direction, e.g., normal to the grating, can increase the efficiency of the combiner in various instances.

To increase efficiency, the two output diffraction orders (e.g., m=+1, −1 orders) can be obtained, while excluding, suppressing, reducing, or minimizing all other orders such as light of the same order diffractive in the opposite direction as well as other higher orders (e.g., m=+2, −2, +3, −3, etc.). For example, the grating may be configured such that a first input beam at a first angle may be diffracted into the m=+1 order while the m=−1 order as well as higher orders, m=±2, m=±3, etc. are excluded, suppressed, reduced, or minimized and the second input beam at a second angle may be diffracted into the m=−1 order while the m=+1 order as well as higher orders, m=±2, m=±3, etc. are excluded, suppressed, reduced, or minimized. In various designs, for example the amount of light reflected and/or transmitted into the m=0 order is 8% or less of the light of the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of these values. Additionally, in various implementations, the amount of light diffracted into other diffraction modes beside the modes corresponding to the combined beam (e.g., m=+1 and m=−1 orders) that is directed in a common direction, e.g., normal to the grating, is negligible. Accordingly, in various designs, the transmission grating 11 and/or combiner can be configured to exclude, suppress, reduce, or minimize the amount of transmitted light in other modes beside the modes corresponding to the combined beam such that the amount of light in the other orders is 8% or less of the amount of light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of such values. Although in some designs more than two inputs and/or output diffraction orders may be utilized, using two inputs and only two orders (e.g., m=+1, −1 orders) can be employed in many instances. Thus, in various implementations, only two input beams are incident on the combiner and one output beam that comprises the superposition of those input beams is produced. In various designs, the grating 11 and/or combiner can be configured to couple the input light 12, 13 into the output beam 14 at an angle (e.g., a single angle or two angles), which may increase the efficiency of the diffraction grating 11 and/or combiner, which is a measure of the output versus input (e.g., optical power of the output beam vs. optical power of the two input beams summed together). In various implementations, the transmission grating 11 and/or combiner can be configured to combine the first and second input beams 12, 13 as an output beam 14 with at least 90%, 95%, 96%, 97%, 98%, 99%, 99.5%, 99.7%, 99.9%, 99.99%, 99.999%, efficiency (or in any ranges formed by such values). In some implementations, the efficiency may be at least 90% and less than 100% or at least 95% and less than 100%, or at least 98%, and less than 100% or even possibly 100% efficiency or in any ranges formed by any of these values or the other values listed above.

In some implementations, the output beam 14 may have a larger lateral dimension (e.g., width) than the width of the input beam or input beams 12, 13. As discussed below, in some designs, an optical element, such as a refractive optical element, a prism, or an optical element configured to provide anamorphic correction, can be introduced into the beam path of the input and/or output beam to reduce the size of the beam, for example, to reduce the width of the beam along one direction but not another direction such as the orthogonal direction.

Light sources such as lasers, for example, first and second lasers may produce the respective first and second beams. The system may be configured so as to produce the input beams (e.g., beams 12 and 13) incident on the respective gratings at a location or at locations and at angles such that the diffracted beams overlap and/or are aligned or substantially aligned and are directed along the same direction. The position and/or orientation of the lasers and/or the first beam combiner may be positioned and angled so as to provide the proper angle and/or position of the beams. Similarly, optical elements may or may not be included such that the first and second beams 12, 13 are appropriately angled and/or positioned. Such optical elements may include, for example, reflective and/or refractive optical elements such as mirrors, prisms, etc.

FIG. 2 is a schematic view of another example of the transmission grating beam combiner 2 of the present disclosure showing two input beams 22, 23 being combined by a transmission grating 21 formed on an optically transparent substrate 20 as part of an all bulk structure (e.g., a monolithic structure). In contrast to FIG. 1, the two beams 22, 23 are shown entering from a top side through the grating 21 and exiting from the bottom of the substrate 20 as a combined beam 24. The bulk structure can be fabricated in any grating material known in the art or yet to be developed, e.g., in fused silica, silicon, diamond, silicon nitride, etc. In various designs, the bulk structure can be fabricated to allow high power handling. For example, the bulk structure can comprise a material having a high laser induced damage threshold, e.g., at least 5.0 eV (e.g., 5.0 eV, 6.0 eV, 7.0 eV, 8.0 eV, 9.0 eV, 10.0 eV, etc. or any ranges formed by any of such values), including but not limited to fused silica, diamond, silicon nitride, aluminum oxide, aluminum nitride, boron nitride, etc.

In other implementations, the grating may be formed in one or more layers disposed on the substrate. In some implementations, the grating may be formed both in one or more layers on the substrate as well as possibly in the substrate although the grating need not be formed in such layers disposed on the substrate. Patterning such as etching may be employed to form the grating. As discussed above, various parameters of the grating and/or combiner such as grating spacing, height and/or width of diffractive features (e.g., groove depth, feature height, groove width, feature width), material and material refractive index, effective refractive index and/or other parameters may be configured to provide the desired features of the grating such as exclusion, suppression, reduction, or minimization of modes such as reflection modes, zeroth order or higher, the m=0 mode at the output of the grating, other possible output modes or beams (e.g., modes of higher order than the output mode), or any combination thereof. For example, in various implementations reflection is excluded, suppressed, reduced, or minimized. The m=0 reflection mode and/or higher order reflection modes may be excluded, suppressed, reduced, or minimized and may be 8% or less of the light of the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or in any ranges formed by any of such values. In various implementation, output modes or beams other than that corresponding the single output beam (e.g., normal to the diffraction grating) and the respective two output modes (e.g., m=+1 and m=−1) that produce the combined output beam are excluded, suppressed, reduced, or minimized. Likewise, in various implementations, transmission of beams other than the output beam, for example, the beam(s) normal to the grating are excluded, suppressed, reduced, or minimized. In various designs, the amount of light transmitted into the m=0 order mode or diffraction modes other than output beam(s), e.g., normal to the grating, can be 8% or less, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of such values.

Accordingly, various implementations include a transmission grating configured such that light from a first beam incident on the grating at a first angle is transmitted through the grating and the transmitted light from the first beam is diffracted into one order while other orders are excluded, suppressed, reduced, or minimized including the zeroth order, which would correspond to light passing straight through the grating undeflected (e.g., where the angle of transmission is equal to the angle of incidence) and the order of the opposite sign but same magnitude. Similarly the transmission grating is configured such that light from a second beam incident on the grating at a second angle is transmitted through the grating and the transmitted light from the second beam is diffracted into another order while other orders are excluded, suppressed, reduced, or minimized including the zeroth order, which would correspond to light passing straight through the grating undeflected (e.g., where the angle of transmission is equal to the angle of incidence) and the order of the opposite sign but same magnitude. For example, the grating may be configured such that a first input beam at a first angle may be diffracted into the m=+1 order while the m=−1 order as well as higher orders, m=±2, m=±3, etc. are excluded, suppressed, reduced, or minimized and the second input beam at a second angle may be diffracted into the m=−1 order while the m=+1 order as well as higher orders, m=±2, m=±3, etc. are excluded, suppressed, reduced, or minimized. As discussed above, for example, negligible amounts of light from the input beams may be diffracted into other modes, such as reflective diffraction modes m=1 or higher or transmissive diffraction modes m=1 or higher other than the mode(s) corresponding to the output beam. Additionally, the amount of undiffracted reflected or transmitted light (e.g., the zeroth order reflection or transmission mode modes) can be 8% or less of the light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of such values. In various implementations, the first and second angles of the respective first and second input beams have different signs, for example, are on opposite sides of the normal to the grating. In some implementations, the first and second angles of the respective first and second input beams have the same magnitude although they may have different magnitudes. In various implementations, the two orders have opposite signs, e.g., + and −. In various implementations, the two orders also have the same order number, e.g., m=1. Moreover, in various implementations the grating is configured such that the angles of the incidence of the first and second beams are such that the respective transmitted beams are diffracted such that the two beams are directed in the same direction. In various implementations, the diffracted beams are also superimposed onto each other thereby forming a combined beam output from the grating. In various implementations, the angle of the diffracted beams is such that the diffracted beams are normal to the grating. Accordingly, in various implementations, the light sources and/or optics delivering the beam to the grating and/or combiner are configured to provide the appropriate beam angles and/or positions for which the input beams are incident on the grating and/or combiner.

FIG. 3 is a schematic view of another example of the transmission grating beam combiner 3 of the present disclosure showing two input beams 32, 33 being combined by a grating 31 having a multilayer stack 35 such as a thin film stack. In various implementations, for example, the multilayer stack 35 comprise a dielectric stack. Similar to FIG. 2, the two beams 32, 33 are shown entering from a top side through the grating 31 and exiting from the bottom of the substrate 30 as a combined beam 34.

The dielectric stack 35 can be formed of different, e.g., alternating layers of material. The materials, thickness, arrangement or any combination thereof can be selected to provide the desired optical performance features such as increasing or maximizing efficiency. In various implementations, the stack comprises an interference structure, however, the stack need not be a quarter wave stack. The substrate 30 can comprise transparent or opaque material, can comprise reflective material and can be flat (e.g., a plate), curved or a combination thereof. The substrate surface can be appropriately prepared prior to affixing the plurality of layers to the substrate 30. Further, the dielectric stack 35 may comprise alternating layers of material transparent to a wavelength of interest, where different layers (e.g., each layer) comprise one or more oxide material, fluoride material, sulfide material, selenide material and/or nitride material in some implementations. Dielectric material can be utilized as or formed on the substrate and such material can include one or more of glass, silica and/or sapphire. Further, the substrate can be formed of organic material, polymeric material, plastics, nylon, resin and/or semiconductor material such as silicon and gallium arsenide.

In various implementations, a multilayer dielectric stack 35 can increase diffraction efficiency and/or optical bandwidth, e.g., via optical impedance matching. For example, the materials and thickness of the various layers in the stack 35 can be selected to reduce, minimize, exclude, and/or suppress the unwanted reflective diffraction modes and/or to reduce, minimize, exclude, and/or suppress the light reflected from the device (e.g., the zeroth reflective order) and/or to reduce, minimize, exclude, and/or suppress the light diffracted or propagating upon transmission into unwanted transmissive diffraction modes and/or beams or directions such as, for example, the zeroth order (m=0) or straight forward beam and/or modes other than (e.g., higher than and/or lower than) the mode or modes or beam or beams corresponding to the single output beam. In some implementations, for example, the stack possibly together with the design of the grating itself may be configured to reduce, minimize, exclude or suppress the higher transmissive diffraction orders such as any one or more of m=±2, m=±3 orders or possibly higher order modes. As referenced above, the materials and thickness of the various layers in the stack 35 can be selected to reduce, minimize, exclude, and/or suppress the light reflected from the diffraction grating 31. As discussed above, for example, the amount of undiffracted reflected or transmitted light (e.g., the zeroth order reflection or transmission modes) can be 8% or less of the light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of such values. Additionally, negligible amounts of light from the input beams may be diffracted into other modes, such as reflective diffraction modes m=1 or higher or transmissive diffraction modes m=1 or higher other than the mode(s) corresponding to the output beam. Accordingly, in various implementations, the combiner is configured to exclude, suppress, reduce, or minimize the amount of light in other orders beside the orders (e.g., two orders) contributing to the output beam (e.g. the amount of light in the other orders whether they be m=0 or higher can be 8% or less of the amount of light in the input beams, 7% or less, 6% or less, 5% or less, 4% or less, 3% or less, 2% or less, 1% or less, 0.5% or less, 0.4% or less, 0.3% or less, 0.2% or less, 0.1% or less, 0.05% or less, 0.03% or less, 0.01% or less, 0, etc., or any ranges formed by any of these values). In some designs, an all-dielectric thin film stack can be used.

The transmission grating 31 can be affixed to, formed in or on, or comprise any of the layers in the multilayer stack 35. The transmission grating 31 can comprise any grating material known in the art or yet to be developed, e.g., as described herein. As discussed above, in various implementations, the combiner, grating, and/or multilayer stack can be configured to exclude, suppress, reduce, or minimize diffraction orders or modes other than the diffraction orders or modes configured to produce the single output beam.

FIG. 4 is a schematic view of another example of the transmission grating beam combiner 4 of the present disclosure, similar to FIG. 3 (e.g., transmission grating 41, dielectric multilayer stack 45, and substrate 40), but having an encapsulated grating (e.g., a bulk window 47 disposed over the grating 41) to increase the laser damage threshold and reliability. Similar to FIGS. 2 and 3, the two beams 42, 43 are shown entering from a top side through the grating 41 and exiting from the bottom of the substrate 40 as a combined beam 44. In some implementations, the bulk window 47 can comprise a material having a bandgap that is at least 5.0 eV (e.g., 5.0 eV, 6.0 eV, 7.0 eV, 8.0 eV, 9.0 eV, 10.0 eV, etc. or any ranges formed by any of such values) and can be bonded (e.g., optical contacting, diffusion bonding, mechanical bonding, etc.) to the grating 41, multilayer dielectric stack 45, and/or substrate 40 as described in U.S. patent application Ser. No. 17/172,979 filed Feb. 10, 2021, published on Aug. 26, 2021 as U.S. Patent Application Publication No. 2021/0263201, which is incorporated herein by reference herein in its entirety.

The high bandgap bulk window 47 can (1) help protect the underlying grating 41 from environmental contaminants (e.g., reducing localized heating) and (2) provide a high bandgap outer surface that is exposed to the highest laser power. Since the bulk window 47 comprises a material with a high bandgap, the grating 41, dielectric multilayer stack 45, and/or substrate 40 may or may not include a layer also having a high bandgap material.

The bulk window 47 can have a thickness of at least 50 microns or >50 microns (e.g., 55 microns, 60 microns, 70 microns, 80 microns, 90 microns, 100 microns, 250 microns, 300 microns, 400 microns, 500 microns, 1,000 microns, 2,000 microns, 3,000 microns, 4,000 microns, 5,000 microns, 10,000 microns, 20,000 microns, 30,000 microns, 40,000 microns, 50,000 microns, 60,000 microns, 70,000 microns, 80,000 microns, 100,000 microns, 200,000 microns, 300,000 microns, 400,000 microns, 500,000 microns etc., or any ranges formed by any of such values).

Although FIG. 4 shows the bulk window 47 disposed over the example comprising a multilayer dielectric stack 45 shown in FIG. 3, a bulk window 47 can also be utilized with the examples shown in FIG. 1 or 2 or with other configurations.

Figure 5:
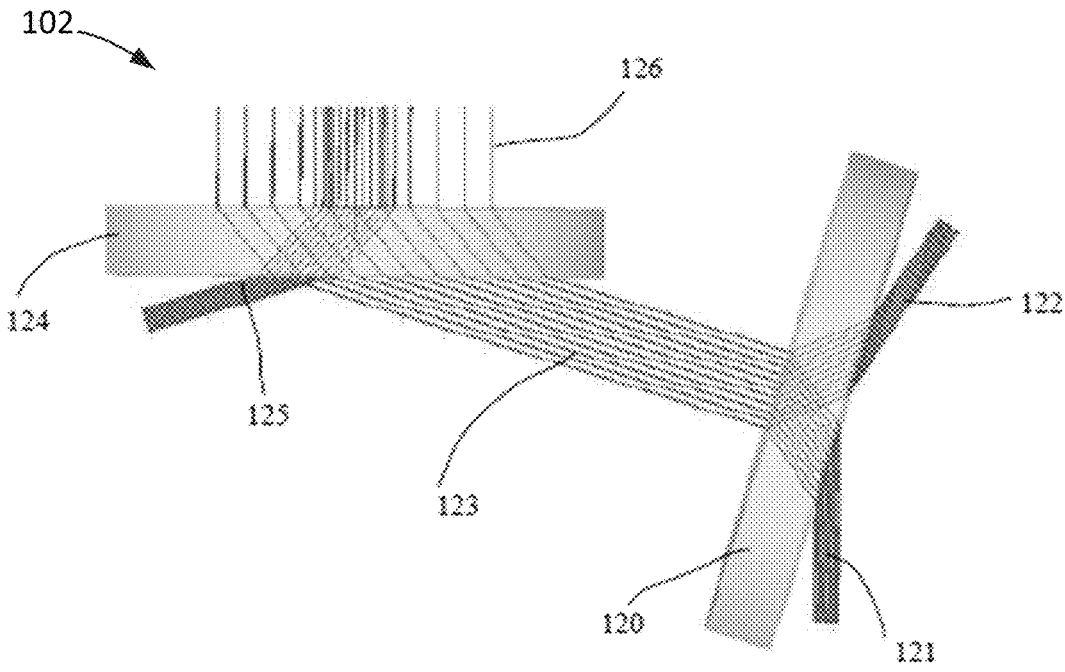
FIG. 5 is a schematic view of an example of the cascaded transmission grating beam combiner, showing two levels of beam combining to combine three beams.

In various instances, a cascaded transmission grating optical beam combiner can be formed using at least two optical elements, each comprising a transmission grating optical beam combiner configured to combine beams as described herein. One optical element can include a similar or different transmission grating optical beam combiner as another optical element. One optical element can be arranged to combine a beam with an output beam from another optical element. FIG. 5 is a schematic view of an example of the cascaded transmission grating beam combiner of the present disclosure, showing two levels of beam combining to combine three beams. In particular, the cascaded arrangement of the combiner 102 includes a first optical element 120 comprising a substrate and grating that functions to combine beams 121 and 122 to produce a first combined beam 123. The first combined beam 123 is next shown combined with a third beam 125 by a second optical element 124 also comprising a substrate and grating to produce a final combined beam 126. In the configuration shown, the first and second optical elements 120, 124 are arranged with respect to each other (e.g., positioned and oriented) such that the first combined beam 123 output by the first transmissive combiner 120 is directed at an angle with respect to the second optical element 124 to diffract into a diffractive order (e.g., m=−1 or m=+1) of the diffraction grating on the second optical element 124 so as to be directed in a similar direction as third input beam 125 also diffracted by the diffraction grating on the second optical element. In the example shown, the first combined beam 123 is diffracted by the second optical element 124 along the normal to the second optical element as is the third input beam 125 to form the final combined beam 126. The relative positioning of the two optical elements is also such that the first combined beam 123 overlaps the third input beam 125 when incident on the grating. The positioning of the optical elements 120, 124 may be such that these beams are superimposed, e.g., in some instances, centered or colinear with respect to each other. As discussed above, the lateral dimension of the output beam may be different, for example, larger than the lateral dimension (e.g., width) of the input beams. This width may be in the plane of incidence (as opposed to orthogonal thereto). This difference in widths is observable in the ray traces shown in FIG. 5. For example, the first combined beam 123 is larger than the input beams 121, 122 directed onto the first optical element 120. The result may be that cascading a number of gratings may increase the beam width of the final beam. As discussed below, optical elements such as prisms may be introduced to reduce the width of the beam (e.g., along the plane of incidence) to counteract or reduce this effect.

Figure 6:
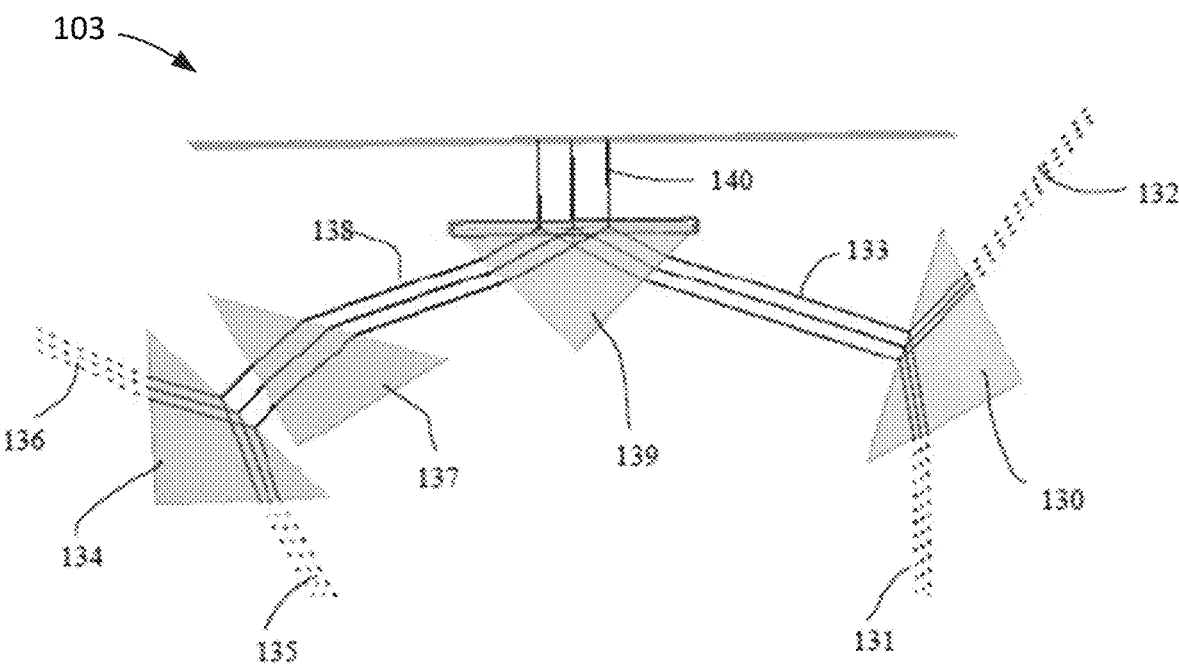
FIG. 6 is a schematic view of another example of the cascaded beam combiner, showing two levels of beam combining to combine four beams, with one branch also including an optical element to provide anamorphic correction.

FIG. 6 is a schematic view of another example of the cascaded transmission grating beam combiner 103 of the present disclosure, showing two levels of beam combining to combine four beams, with one branch also including an optical element to decrease the width of a combined beam before incidence on the next optical element, e.g., to provide anamorphic correction. In the first level, a first optical element 130 (comprising a transmission grating formed on a substrate) is shown combining two beams 131 and 132 to produce a first beam 133, and a second optical element 134

(comprising a grating formed on a substrate) is shown combining two beams 135 and 136 to produce an output beam that is then anamorphically corrected (e.g., to decrease the width of the beam) by optical element 137 (e.g., such as a refractive optical element, a prism, etc.) to produce a second beam 138. The first beam 133 and the second beam 138 are then combined by a third optical element 139 (comprising a transmission grating formed on a substrate) to produce a next-level combined beam 140. In FIG. 6, the optical element 137 is configured to decrease the width of the output beam from optical element 134 prior to incidence on optical element 139. In addition, the optical elements 130, 134, and 139 are illustrated as transmission gratings formed on prisms as substrates. In some implementations, for grating designs having orders in the glass, a prism shaped substrate can allow those orders out of the glass, e.g., at normal incidence. As discussed above, the diffractive optical elements, for example, the first, second and third beam combiners 130, 134, 139 are positioned and angled with respect to each other such that light is incident on the respective gratings at angles that diffract the beams into the appropriate orders (e.g., m=+1, and m=−1) and in the appropriate direction so as to be directed in the same direction and that the beams overlap and/or are aligned or substantially aligned at the respective diffraction grating. Similarly, the first and second beam combiners 130, 134 are positioned and angled with respect to the lasers producing the input beams (e.g., beams 131 and 132 as well as beams 135 and 136) such that light is incident on the respective gratings at angles that diffract into the appropriate orders (e.g., m=+1, and m=−1) and in the appropriate direction so as to be directed in the same direction and that the beams overlap and/or are aligned or substantially aligned at the respective diffraction grating.

The optical element 137 shown in FIG. 6 may comprise a refractive optical element or an optical element configured to alter the beam width in one direction (e.g., in or parallel to the plane of incidence) compared to another direction (e.g., orthogonal to the plane of incidence). The optical element 137 shown comprises a triangular prism. The prism has one cross section (e.g., parallel to the plane of incidence) that is triangular. The other surfaces may be square or rectangular in various implementations. The triangle may comprise a right triangle with one angle being a right angle but need not be a right triangle. In some instances, the grating can be formed on the side of the prism opposite to the vertex having the widest or largest internal angle. In some cases, this angle is close to 90 degrees and the triangle is close to a right triangle. However, in many cases, this internal angle is not 90 degrees, but may be greater than 45°, 50°, 60°, 70°, 80°, 85°, 89°, 90° and may be less than 135°, 125°, 115°, 110°, 105°, 100°, 95°, 90° or may be any angle in any range formed by any of these values. Values outside these ranges are also possible. In some designs, the prism can be used with polarized light, e.g., in a manner to increase efficiency. In some implementations, the prism is designed such that the input beam is incident on the prism at an angle to reduce reflection of one polarization. For example, in some implementations, the prism is designed such that the input beam is incident on the prism at Brewster's angle to reduce reflection of one polarization. The optical element 137 is disposed in the optical path between the second and third optical element 134, 139 to reduce the beam output by the second optical element. Other optical elements 137 configured to decrease the width of beams can include cascaded gratings and/or a set of cylindrical lenses, e.g., for an afocal telescope in one dimension.

Figure 7:
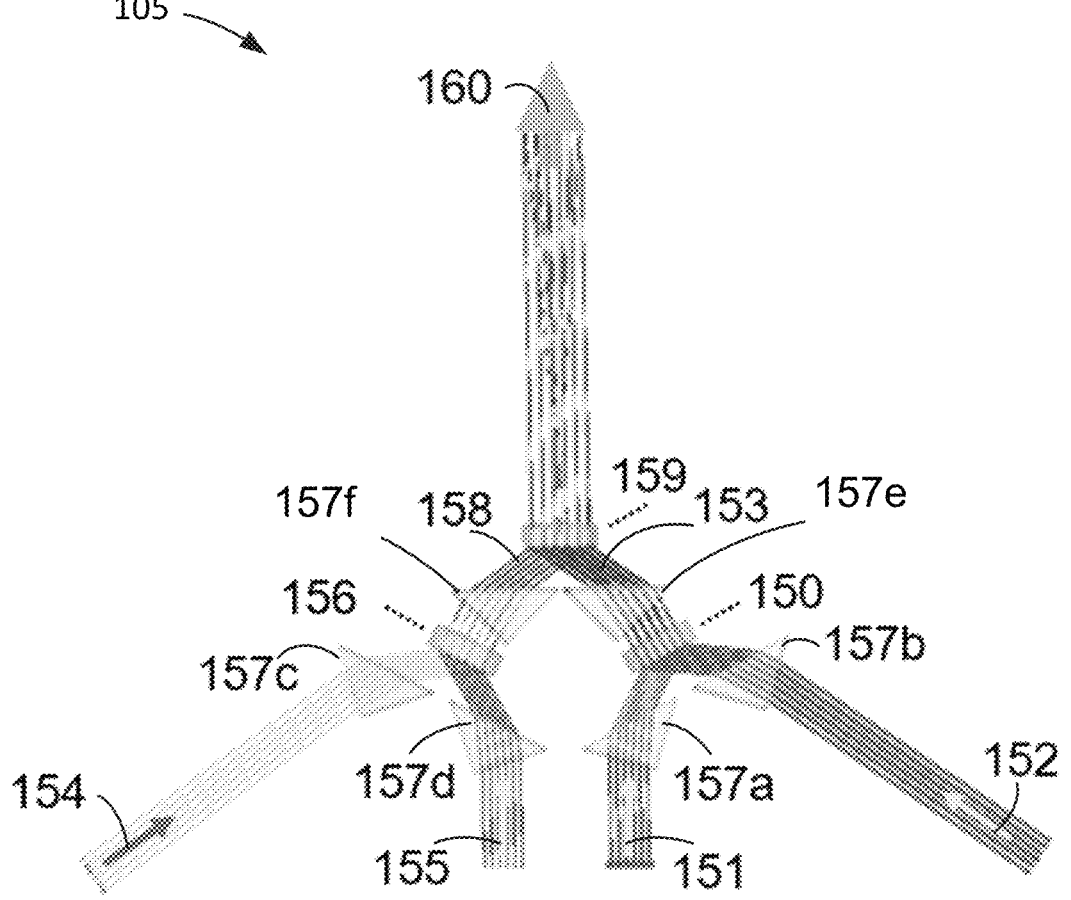
FIG. 7 is a schematic view of another example of the cascaded combiner, showing two levels of beam combining to combine four beams, and a plurality of optical elements (e.g. 6 prisms in this example) to provide anamorphic correction.

More beam combiners can be added to combine more beams and thus optical power into the final beam. For example, branches can be added and multiple levels of branching can be provided. For instance, FIG. 7 is a schematic view of another example of the cascaded transmission grating beam combiner 105 of the present disclosure, showing two levels of beam combining to combine four beams 151, 152, 154, 155. In the first level, a first optical element 150 (comprising a transmission grating formed on a substrate) is shown receiving two beams 151, 152, with the two beam 151, 152 reduced in width by respective prisms 157a, 157b such as described above. Also at the first level, a second optical element 156 (comprising a transmission grating formed on a substrate) is shown receiving two beams 154, 155, with the two beams 154, 155 reduced in width by respective prisms 157c, 157d. The first and second optical elements 150, 156 have outputs that are combined into a combined beam 153, 158 whose width is decreased by prisms 157e, 157f respectively prior to incidence on optical element 159. The combined beams 153, 158 from the two branches are then combined by optical element 159 (comprising a transmission grating formed on a substrate) to produce a next-level combined beam 160. In some instances, the combined beam 160 can be further utilized as an input beam for another level of beam combining. In addition, any of the input beams 151, 152, 154, 155 may be a combined beam.

Various examples described herein include transmission grating optical beam combiners or cascaded transmission grating optical beam combiners. Moreover, in some implementations, systems of combining beams can utilize any of the beam combiners described herein. For example, in some instances, a system of combining optical beams can include a transmission grating optical beam combiner (e.g., comprising a transmission grating formed on a substrate), a first laser arranged to produce a first input beam incident on the transmission grating, and a second laser arranged to produce a second input beam incident on the transmission grating. Some implementations can include cascaded transmission gratings. For example, one transmission grating can combine a beam with the superimposed and/or colinear output beam from another transmission grating as a next-level superimposed and/or colinear output beam. Some systems can also include one or more optical elements configured to decrease the width of the superimposed and/or colinear output beam from one transmission grating prior to incidence on another transmission grating.

Figure 8:
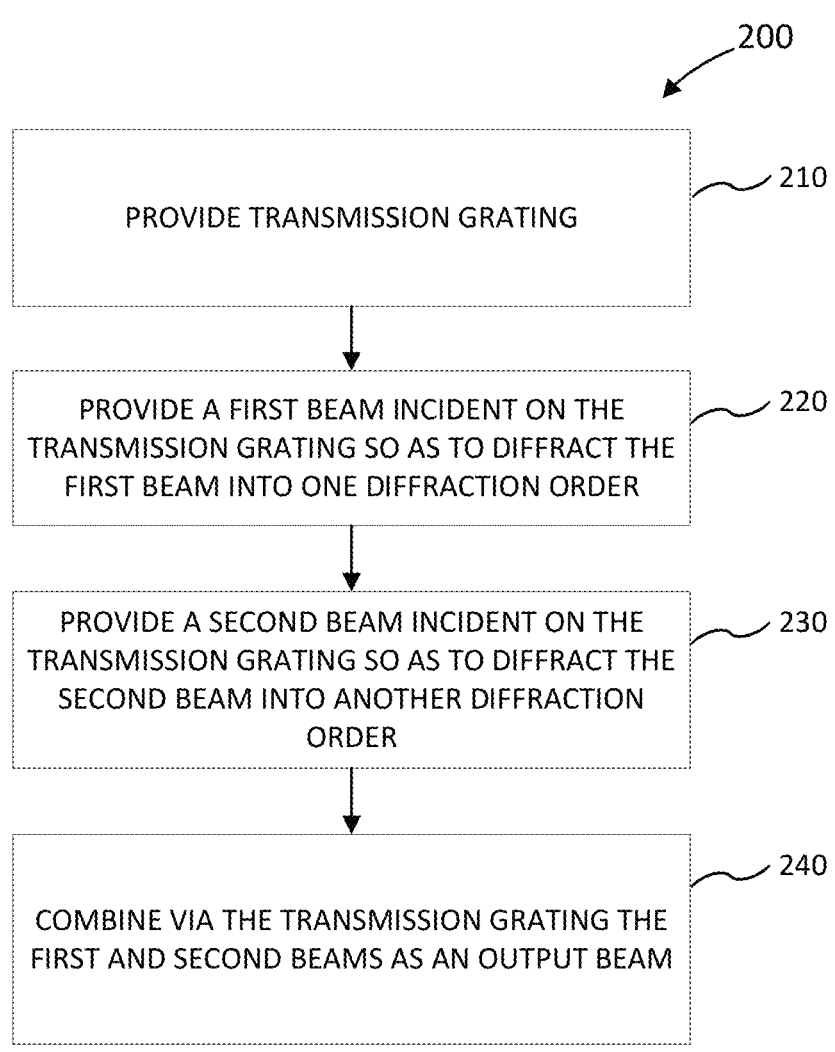
FIG. 8 is a flow diagram schematically illustrating an example method of combining beams.

Various implementations described herein also include methods of combining optical beams. FIG. 8 is a flow diagram schematically illustrating an example method of combining beams. The method 200 of combining beams can include providing a transmission grating as shown in block 210. The transmission grating can include any of the transmission gratings as described herein. As shown in block 220, the method 200 can include providing a first beam incident on the transmission grating such that the first beam is diffracted by the diffraction grating into one diffraction order thereof. As shown in block 230, the method 200 can also include providing a second beam incident on the transmission grating such that the second beam is diffracted by the diffraction grating into another diffraction order thereof. In various implementations, the amount of light diffracted into other diffraction orders can be excluded, suppressed, reduced, or minimized, e.g., to increase efficiency. Similarly, the light reflected and/or transmitted undiffracted can also be reduced, for example to 5% or less, 1% or less, 0.1% or less, or 0 or any range formed by any of these values. The method 200 can also include combining via the transmission grating the first and second beams by superimposing the beams on each other to form a single output beam. In some instances, the diffraction orders can comprise opposite diffraction orders, e.g., on opposite side of zeroth order (e.g., plus and minus diffraction orders). For example, the order number can be the same, e.g., m=1 but the signs can be opposite, m=+1 and m=−1. The diffraction grating can diffract the input beams such that both beams diffract so as to be directed in the same direction, for example, normal to the transmission grating 11. In some examples, the diffraction orders can comprise +1 and −1 diffraction orders. As described herein, other examples are possible.

In some methods, the method 200 can include providing one or more additional transmission gratings. The method 200 can also include combining via the additional transmission grating a beam with the output beam from the first transmission grating as a next-level output beam. In some methods, the method 200 can further include decreasing the width of the output beam from the first transmission grating prior to incidence on the additional transmission grating. In some implementations, the beam from the laser can be reduced prior to being incident on the first beam combiner in an effort to offset the increase in size of the beam provided by the optical combiner. As discussed, the width of the beam may be reduced in one direction more than another (such as in a direction parallel to the plane of incidence more than the direction perpendicular to the plane of incidence), for example, using an optical element such as a refractive optical element, a prism, or an optical element to provide anamorphic correction.

In various implementations of the cascaded beam combiners such as monochromatic cascaded beam combiners, small beam size and low material absorption are employed. When small beam diameter beams are combined, wavelength bandwidth dispersion as angular divergence can hide under the small beam angular dispersion, thus becoming less of a concern as the beams are telescopically enlarged through subsequent larger aperture amplifiers. The smaller the different beams exiting and overlapping on the output grating, the larger spectral width angular dispersion offset from perfect collinearity is accommodated by the cascaded beam combiners or monochromatic cascaded beam combiners.

EXAMPLES

This disclosure provides various examples of devices, systems, and methods of combining optical beam. Some such examples include but are not limited to the following examples.

1. A transmission grating optical beam combiner, comprising:
   an optically transparent substrate; and
   a transmission grating on the substrate configured to combine first and second input beams into a single output beam, said transmission grating configured such that when the first and second input beams are incident on the transmission grating at first and second angles, respectively, the first and second beams are transmitted through the grating and diffracted into two different diffraction orders of the grating such that the first and second diffracted beams are directed towards the same direction.

2. The optical beam combiner of example 1, wherein the diffraction orders comprise plus and minus diffraction modes.

3. The optical beam combiner of any of example 1 or 2, wherein the diffraction orders comprise the plus and minus first diffraction orders.

4. The optical beam combiner of any of example 1, 2 or 3, wherein the diffraction orders comprise +1 and −1 diffraction orders.

5. The optical beam combiner of any of the preceding examples, wherein the first and second input beams are incident on the transmission grating at first and second angles respectively, and wherein the transmission grating outputs the output beam at an angle not equal to the first or second angle.

6. The optical beam combiner of any of the preceding examples, wherein the transmission grating outputs the output beam at an angle normal to the transmission grating.

7. The optical beam combiner of any of the preceding examples, wherein the first and second input beams are incident on the transmission grating at first and second angles respectively, and wherein the first and second angles are on opposite sides of the normal to the transmission grating.

8. The optical beam combiner of any of the preceding examples, wherein the transmission grating is configured to combine the first and second input beams as a single colinear output beam.

9. The optical beam combiner of any of the preceding examples, wherein the transmission grating is formed in the optically transparent substrate as part of a monolithic structure.

10. The optical beam combiner of any of examples 1-8, wherein the transmission grating is formed on a layer on said substrate.

11. The optical beam combiner of any of the preceding examples, wherein said substrate comprises a plate.

12. The optical beam combiner of any of the preceding examples, wherein said transmission grating is on a prism.

13. The optical beam combiner of any of the preceding examples, wherein said transmission grating is on a triangular prism.

14. The optical beam combiner of any of the preceding examples, wherein transmission grating is on a triangular prism having a cross-section that is the shape of a triangle, said transmission grating being on a side of the prism opposite the vertex with the largest interior angle.

15. The optical beam combiner of any of the preceding examples, further comprising a multilayer stack.

16. The optical beam combiner of example 15, wherein said multilayer stack comprises a dielectric multilayer stack.

17. The optical beam combiner of examples 15 or 16, wherein said grating is over said multilayer stack.

18. The optical beam combiner of any of examples 15-17, wherein said multilayer stack is configured to exclude, suppress, reduce, or minimize the zeroth order transmission mode of the transmission diffraction grating.

19. The optical beam combiner of any of examples 15-18, wherein said multilayer stack is configured to exclude, suppress, reduce, or minimize output of at least one higher order transmissive diffraction mode.

20. The optical beam combiner of any of examples 15-19, wherein said multilayer stack is configured to exclude, suppress, reduce, or minimize reflection.

21. The optical beam combiner of any of examples 15-20, wherein said multilayer stack is configured to exclude, suppress, reduce, or minimize the zeroth order reflection mode.

22. The optical beam combiner of any of examples 15-21, wherein said multilayer stack is configured to exclude, suppress, reduce, or minimize the reflection modes higher than the zeroth order reflection mode.

23. The optical beam combiner of any of the preceding examples, wherein the optically transparent substrate comprises a prism.

24. The optical beam combiner of any of the preceding examples, further comprising a bulk window disposed with respect to the transmission grating to increase the laser induced damage threshold of the transmission grating, the bulk window comprising a material having a band gap that is from 5.0 eV to 10.0 eV.

25. The optical beam combiner of any of the preceding examples, wherein the first input beam has a first wavelength distribution and the second input beams has a second wavelength distribution and the first and second wavelength distributions overlap.

26. The optical beam combiner of any of the preceding examples, wherein the first input beam has a first wavelength distribution and the second input beams has a second wavelength distribution and the first and second wavelength distributions are the same.

27. The optical beam combiner of any of the preceding examples, wherein the first input beam has a first wavelength distribution, the second input beams has a second wavelength distribution, and the output beam has a wavelength distribution and the wavelength distributions of the first input beam, the second input beam, and the output beam overlap.

28. The optical beam combiner of any of the preceding examples, wherein the first input beam has a first wavelength distribution, the second input beams has a second wavelength distribution, and the output beam has a wavelength distribution and the wavelength distributions of the first input beam, the second input beam, and the output beam are the same.

29. The optical beam combiner of any of the preceding examples, wherein the first and second input beams are monochromatic.

30. The optical beam combiner of any of the preceding examples, wherein the output beam is monochromatic.

31. The optical beam combiner of any of examples 1-30, wherein the first and second input beams have different spectral distributions.

32. The optical beam combiner of any of the preceding examples, wherein the first and second input beams have spectral distributions with a full width at half-maximum less than or equal to 20 nanometers.

33. The optical beam combiner of any of the preceding examples, wherein the first and second input beams have the same polarization.

34. The optical beam combiner of any of examples 1-32, wherein the first and second input beams have different polarizations.

35. The optical beam combiner of any of examples 1-33, wherein the first and second input beams have random polarization.

36. The optical beam combiner of any of the preceding examples, wherein the transmission grating is configured to combine the first and second input beams as an output beam with at least 90% efficiency.

37. The optical beam combiner of any of the preceding examples, wherein the transmission grating is configured to combine the first and second input beams as an output beam with at least 95% efficiency.

38. The optical beam combiner of any of the preceding examples, wherein the transmission grating is configured to combine the first and second input beams as an output beam with at least 99% efficiency.

39. The optical beam combiner of any of the preceding examples, wherein the transmission grating is configured such that the output beam exits along a path that is at an angle with respect to the normal to the transmission grating that is between the angles of the first and second input beams with respect to the normal to the transmission grating.

40. The optical beam combiner of any of the preceding examples, wherein the transmission grating is configured such that the output beam exits along a path that is at an angle with respect to the normal to the transmission grating that bisects the angles of the first and second input beams with respect to the normal to the transmission grating.

41. The optical beam combiner of any of the preceding examples, wherein the transmission grating is configured such that the first and second input beams are angled with respect to the normal to the transmission grating at respective angles, θ, that are equal in magnitude and opposite in sign.

42. The optical beam combiner of any of the preceding examples, wherein the transmission grating is configured such that the output beam exits along a path that is at an angle more normal to the grating than the first and second input beams.

43. The optical beam combiner of any of the preceding examples, wherein the transmission grating is configured such that the output beam exits along a path normal to the transmission grating.

44. The optical beam combiner of any of the preceding examples, wherein the transmission grating is configured such that the output beam exits along a path normal to the substrate.

45. A system of combining optical beams, the system comprising:
   the transmission grating optical beam combiner of any of examples 1-44;
   a first laser arranged to provide the first input beam incident on the transmission grating; and
   a second laser arranged to provide the second input beam incident on the transmission grating.

46. The system of combining optical beams of example 45, where the system is configured to provide the first beam incident on the transmission grating optical beam combiner at said first angle and is configured to provide the second beam incident on the transmission optical beam combiner at said second angle.

47. The system of combining optical beams of examples 45 or 46, where the system is configured to provide the first beam incident on the transmission grating optical beam combiner and the second beam incident on the transmission optical beam combiner such that said first and second beams overlap on said grating.

48. The system of any of examples 45-47, wherein the transmission grating is a first transmission grating, the system further comprising a second transmission grating configured to combine a third beam with the output beam from the first transmission grating.

49. The system of example 48, further comprising one or more optical elements configured to decrease the width of the output beam from the first transmission grating.

50. The system of example 49, wherein said one or more optical elements configured to decrease the width of the output beam from the first transmission grating comprises a refractive optical element.

51. The system of example 49 or 50, wherein said one or more optical elements configured to decrease the width of the output beam from the first transmission grating comprises a prism.

52. The system of any of examples 49-51, wherein said decrease in width is more in one direction than another.

53. The system of any of examples 49-52, wherein said one or more optical elements configured to decrease the width of the output beam from the first transmission grating comprises an optical element oriented at an angle with respect to the light beam incident thereon to alter the beam size more in one direction than another.

54. The system of any of examples 49-53, wherein said one or more optical elements configured to decrease the width of the output beam from the first transmission grating is oriented at an angle with respect to the light beam incident thereon to reduce the beam size in a direction in the plane of incidence.

55. The system of any of examples 49-54, wherein said one or more optical elements configured to decrease the width of the output beam from the first transmission grating comprises a prism configured to provide anamorphic correction of the light beam incident thereon.

56. The system of any of examples 48-55, the system further comprising a third transmission grating configured to combine at least a fourth beam with the output beam from the first transmission grating.

57. A cascaded transmission grating optical beam combiner, comprising:
   at least two optical elements, each comprising: a substrate, and a transmission grating formed on the substrate and configured to combine first and second input beams as a single output beam;
   wherein a first optical element is arranged to combine a third beam with a single output beam from a second optical element as a next-level single output beam.

58. The optical beam combiner of example 57, wherein when the first and second input beams are incident on the transmission grating at first and second angles, respectively, the first and second beams are transmitted through the grating and diffracted into two different diffraction orders of the grating such that the first and second diffracted beams are directed towards the same direction.

59. The optical beam combiner of example 57 or 58, wherein the diffraction orders comprise plus and minus diffractive orders.

60. The optical beam combiner of any of examples 57-59, wherein the diffraction orders comprise the plus and minus first diffraction orders.

61. The optical beam combiner of any of examples 57-60, wherein the diffraction orders comprise +1 and −1 diffraction orders.

62. The optical beam combiner of any of examples 57-61, wherein the first and second input beams are incident on the transmission grating at first and second angles respectively, and wherein the transmission grating outputs the output beam at an angle not equal to the first or second angle.

63. The optical beam combiner of any of examples 57-62, wherein the transmission grating outputs the output beam at an angle normal to the transmission grating.

64. The optical beam combiner of any of examples 57-63, wherein the first and second input beams are incident on the transmission grating at first and second angles respectively, and wherein the first and second angles are on opposite sides of the normal to the transmission grating.

65. The optical beam combiner of any of examples 57-64, wherein the transmission grating is configured to combine the first and second input beams as a single colinear output beam.

66. The optical beam combiner of any of examples 57-65, wherein the transmission grating is formed in the substrate as part of a monolithic structure.

67. The optical beam combiner of any of examples 57-65, wherein the transmission grating is formed on a layer on said substrate.

68. The optical beam combiner of any of examples 57-67, wherein said substrate comprises a plate.

69. The optical beam combiner of any of examples 57-68, wherein said transmission grating is on a prism.

70. The optical beam combiner of any of examples 57-69, wherein said transmission grating is on a triangular prism.

71. The optical beam combiner of any of examples 57-70, wherein transmission grating is on a triangular prism having a cross-section that is the shape of a triangle, said transmission grating being on a side of the prism opposite the vertex with the largest interior angle.

72. The optical beam combiner of any of examples 57-71, further comprising a multilayer stack.

73. The optical beam combiner of example 72, wherein said multilayer stack comprises a dielectric multilayer stack.

74. The optical beam combiner of examples 72 or 73, wherein said grating is over said multilayer stack.

75. The optical beam combiner of any of examples 72-74, wherein said multilayer stack is configured to exclude, suppress, reduce, or minimize the zeroth order transmission mode of the transmission diffraction grating.

76. The optical beam combiner of any of examples 72-75, wherein said multilayer stack is configured to exclude, suppress, reduce, or minimize output of at least one higher order transmissive diffraction mode.

77. The optical beam combiner of any of examples 72-76, wherein said multilayer stack is configured to exclude, suppress, reduce, or minimize reflection.

78. The optical beam combiner of any of examples 72-77, wherein said multilayer stack is configured to exclude, suppress, reduce, or minimize the zeroth order reflection mode.

79. The optical beam combiner of any of examples 72-78, wherein said multilayer stack is configured to exclude, suppress, reduce, or minimize the reflection modes higher than the zeroth order reflection mode.

80. The optical beam combiner of any of examples 57-79, wherein the substrate comprises a prism.

81. The optical beam combiner of any of examples 57-80, further comprising a bulk window disposed with respect to the transmission grating to increase the laser induced damage threshold of the transmission grating, the bulk window comprising a material having a band gap that is from 5.0 eV to 10.0 eV.

82. The optical beam combiner of any of examples 57-81, wherein the first input beam has a first wavelength distribution and the second input beams has a second wavelength distribution and the first and second wavelength distributions overlap.

83. The optical beam combiner of any of examples 57-82, wherein the first input beam has a first wavelength distribution and the second input beams has a second wavelength distribution and the first and second wavelength distributions are the same.

84. The optical beam combiner of any of examples 57-83, wherein the first input beam has a first wavelength distribution, the second input beams has a second wavelength distribution, and the output beam has a wavelength distribution and the wavelength distributions of the first input beam, the second input beam, and the output beam overlap.

85. The optical beam combiner of any of examples 57-84, wherein the first input beam has a first wavelength distribution, the second input beams has a second wavelength distribution, and the output beam has a wavelength distribution and the wavelength distributions of the first input beam, the second input beam, and the output beam are the same.

86. The optical beam combiner of any of examples 57-85, wherein the first and second input beams are monochromatic.

87. The optical beam combiner of any of examples 57-86, wherein the output beam is monochromatic.

88. The optical beam combiner of any of examples 57-87, wherein the first and second input beams have different spectral distributions.

89. The optical beam combiner of any of examples 57-88, wherein the first and second input beams have spectral distributions with a full width at half-maximum less than or equal to 20 nanometers.

90. The optical beam combiner of any of examples 57-89, wherein the first and second input beams have the same polarization.

91. The optical beam combiner of any of examples 57-89, wherein the first and second input beams have different polarizations.

92. The optical beam combiner of any of examples 57-89, wherein the first and second input beams have random polarization.

93. The optical beam combiner of any of examples 57-92, wherein the transmission grating is configured to combine the first and second input beams as an output beam with at least 90% efficiency.

94. The optical beam combiner of any of examples 57-93, wherein the transmission grating is configured to combine the first and second input beams as an output beam with at least 95% efficiency.

95. The optical beam combiner of any of examples 57-94, wherein the transmission grating is configured to combine the first and second input beams as an output beam with at least 99% efficiency.

96. The optical beam combiner of any of examples 57-95, wherein the transmission grating is configured such that the output beam exits along a path that is at an angle with respect to the normal to the transmission grating that is between the angles of the first and second input beams with respect to the normal to the transmission grating.

97. The optical beam combiner of any of examples 57-96, wherein the transmission grating is configured such that the output beam exits along a path that is at an angle with respect to the normal to the transmission grating that bisects the angles of the first and second input beams with respect to the normal to the transmission grating.

98. The optical beam combiner of any of examples 57-97, wherein the transmission grating is configured such that the first and second input beams are angled with respect to the normal to the transmission grating at respective angles, θ, that are equal in magnitude and opposite in sign.

99. The optical beam combiner of any of examples 57-98, wherein the transmission grating is configured such that the output beam exits along a path that is at an angle more normal to the grating than the first and second input beams.

100. The optical beam combiner of any of examples 57-99, wherein the transmission grating is configured such that the output beam exits along a path normal to the transmission grating.

101. The optical beam combiner of any of examples 57-100, wherein the transmission grating is configured such that the output beam exits along a path normal to the substrate.

102. A method of combining optical beams, the method comprising:
providing a transmission grating;
providing first and second input beams incident on the transmission grating at first and second angles, respectively; and
transmitting the first and second beams through the grating and diffracting the first and second beams into two different diffraction orders of the grating such that the first and second diffracted beams are directed towards the same direction.

103. The method of example 102, wherein providing the first beam incident on the transmission grating optical beam combiner and providing the second beam incident on the transmission optical beam combiner comprise providing the first and second beams such that said first and second beams overlap on said grating.

104. The method of example 102 or 103, wherein the transmission grating is a first transmission grating, the method further comprising:
providing a second transmission grating; and
combining via the second transmission grating a third beam with the output beam from the first transmission grating.

105. The method of example 104, further comprising decreasing the width of the output beam from the first transmission grating prior to incidence on the second transmission grating.

106. The method of example 105, wherein decreasing the width of the output beam from the first transmission grating comprises decreasing the width with a refractive optical element.

107. The method of example 105 or 106, wherein decreasing the width of the output beam from the first transmission grating comprises decreasing the width with a prism.

108. The method of any of examples 105-107, wherein said decrease in width is more in one direction than another.

109. The method of any of examples 105-108, wherein decreasing the width of the output beam from the first transmission grating comprises decreasing the width with an optical element oriented at an angle with respect to the light beam incident thereon to alter the beam size more in one direction than another.

110. The method of any of examples 105-109, wherein decreasing the width of the output beam from the first transmission grating comprises decreasing the width with an optical element oriented at an angle with respect to the light beam incident thereon to reduce the beam size in a direction in the plane of incidence.

111. The method of any of examples 105-110, wherein decreasing the width of the output beam from the first transmission grating comprises decreasing the width with a prism configured to provide anamorphic correction of the light beam incident thereon.

112. A transmission grating optical beam combiner, comprising:
an optically transparent substrate; and
a transmission grating on the substrate and configured to combine first and second input beams as a single output beam, wherein the first input beam and second input beam are incident on the transmission grating at respective first and second angles, said first input beam on an opposite sides of the output beam as the second input beam.

113. The optical beam combiner of any of the preceding examples, wherein the first and second input beams are incident on the transmission grating at first and second angles respectively, and wherein the transmission grating outputs the output beam at an angle not equal to the first or second angle.

114. The optical beam combiner of any of the preceding examples, wherein the transmission grating outputs the output beam at an angle normal to the transmission grating.

115. The optical beam combiner of any of the preceding examples, wherein the first and second input beams are incident on the transmission grating at first and second angles respectively, and wherein the first and second angles are on opposite sides of the normal to the transmission grating.

116. The optical beam combiner of any of the preceding examples, wherein the transmission grating is configured to combine the first and second input beams as a single colinear output beam.

117. The optical beam combiner of any of the preceding examples, wherein the transmission grating is formed in the optically transparent substrate as part of a monolithic structure.

118. The optical beam combiner of any of examples 112-116, wherein the transmission grating is formed on a layer on said substrate.

119. The optical beam combiner of any of the preceding examples, wherein said substrate comprises a plate.

120. The optical beam combiner of any of the preceding examples, wherein said transmission grating is on a prism.

121. The optical beam combiner of any of the preceding examples, wherein said transmission grating is on a triangular prism.

122. The optical beam combiner of any of the preceding examples, wherein transmission grating is on a triangular prism having a cross-section that is the shape of a triangle, said transmission grating being on a side of the prism opposite the vertex with the largest interior angle.

123. The optical beam combiner of any of the preceding examples, further comprising a multilayer stack.

124. The optical beam combiner of example 123, wherein said multilayer stack comprises a dielectric multilayer stack.

125. The optical beam combiner of examples 123 or 124, wherein said grating is over said multilayer stack.

126. The optical beam combiner of any of examples 123-125, wherein said multilayer stack is configured to exclude, suppress, reduce, or minimize the zeroth order transmission mode of the transmission diffraction grating.

127. The optical beam combiner of any of examples 123-126, wherein said multilayer stack is configured to exclude, suppress, reduce, or minimize output of at least one higher order transmissive diffraction mode.

128. The optical beam combiner of any of examples 123-127, wherein said multilayer stack is configured to exclude, suppress, reduce, or minimize reflection.

129. The optical beam combiner of any of examples 123-128, wherein said multilayer stack is configured to exclude, suppress, reduce, or minimize the zeroth order reflection mode.

130. The optical beam combiner of any of examples 123-129, wherein said multilayer stack is configured to exclude, suppress, reduce, or minimize the reflection modes higher than the zeroth order reflection mode.

131. The optical beam combiner of any of the preceding examples, wherein the optically transparent substrate comprises a prism.

132. The optical beam combiner of any of the preceding examples, further comprising a bulk window disposed with respect to the transmission grating to increase the laser induced damage threshold of the transmission grating, the bulk window comprising a material having a band gap that is from 5.0 eV to 10.0 eV.

133. The optical beam combiner of any of the preceding examples, wherein the first input beam has a first wavelength distribution and the second input beams has a second wavelength distribution and the first and second wavelength distributions overlap.

134. The optical beam combiner of any of the preceding examples, wherein the first input beam has a first wavelength distribution and the second input beams has a second wavelength distribution and the first and second wavelength distributions are the same.

135. The optical beam combiner of any of the preceding examples, wherein the first input beam has a first wavelength distribution, the second input beams has a second wavelength distribution, and the output beam has a wavelength distribution and the wavelength distributions of the first input beam, the second input beam, and the output beam overlap.

136. The optical beam combiner of any of the preceding examples, wherein the first input beam has a first wavelength distribution, the second input beams has a second wavelength distribution, and the output beam has a wavelength distribution and the wavelength distributions of the first input beam, the second input beam, and the output beam are the same.

137. The optical beam combiner of any of the preceding examples, wherein the first and second input beams are monochromatic.

138. The optical beam combiner of any of the preceding examples, wherein the output beam is monochromatic.

139. The optical beam combiner of any of examples 112-135, 137, or 138, wherein the first and second input beams have different spectral distributions.

140. The optical beam combiner of any of the preceding examples, wherein the first and second input beams have spectral distributions with a full width at half-maximum less than or equal to 20 nanometers.

141. The optical beam combiner of any of the preceding examples, wherein the first and second input beams have the same polarization.

142. The optical beam combiner of any of examples 112-140, wherein the first and second input beams have different polarizations.

143. The optical beam combiner of any of examples 112-140, wherein the first and second input beams have random polarization.

144. The optical beam combiner of any of the preceding examples, wherein the transmission grating is configured to combine the first and second input beams as an output beam with at least 90% efficiency.

145. The optical beam combiner of any of the preceding examples, wherein the transmission grating is configured to combine the first and second input beams as an output beam with at least 95% efficiency.

146. The optical beam combiner of any of the preceding examples, wherein the transmission grating is configured to combine the first and second input beams as an output beam with at least 99% efficiency.

147. The optical beam combiner of any of the preceding examples, wherein the transmission grating is configured such that the output beam exits along a path that is at an angle with respect to the normal to the transmission grating that is between the angles of the first and second input beams with respect to the normal to the transmission grating.

148. The optical beam combiner of any of the preceding examples, wherein the transmission grating is configured such that the output beam exits along a path that is at an angle with respect to the normal to the transmission grating that bisects the angles of the first and second input beams with respect to the normal to the transmission grating.

149. The optical beam combiner of any of the preceding examples, wherein the transmission grating is configured such that the first and second input beams are angled with respect to the normal to the transmission grating at respective angles, $\theta$, that are equal in magnitude and opposite in sign.

150. The optical beam combiner of any of the preceding examples, wherein the transmission grating is configured such that the output beam exits along a path that is at an angle more normal to the grating than the first and second input beams.

151. The optical beam combiner of any of the preceding examples, wherein the transmission grating is configured such that the output beam exits along a path normal to the transmission grating.

152. The optical beam combiner of any of the preceding examples, wherein the transmission grating is configured such that the output beam exits along a path normal to the substrate.

153. A system of combining optical beams, the system comprising:
the transmission grating optical beam combiner of any of examples 112-152;
a first laser arranged to provide the first input beam incident on the transmission grating; and
a second laser arranged to provide the second input beam incident on the transmission grating.

154. The system of combining optical beams of example 153, where the system is configured to provide the first beam incident on the transmission grating optical beam combiner at said first angle and is configured to provide the second beam incident on the transmission optical beam combiner at said second angle.

155. The system of combining optical beams of examples 153 or 154, where the system is configured to provide the first beam incident on the transmission grating optical beam combiner and the second beam incident on the transmission optical beam combiner such that said first and second beams overlap on said grating.

156. The system of any of examples 112-155, wherein the transmission grating is a first transmission grating, the system further comprising a second transmission grating configured to combine a third beam with the output beam from the first transmission grating.

157. The system of example 156, further comprising one or more optical elements configured to decrease the width of the output beam from the first transmission grating.

158. The system of example 157, wherein said one or more optical elements configured to decrease the width of the output beam from the first transmission grating comprises a refractive optical element.

159. The system of example 157 or 158, wherein said one or more optical elements configured to decrease the width of the output beam from the first transmission grating comprises a prism.

160. The system of any of examples 157-159, wherein said decrease in width is more in one direction than another.

161. The system of any of examples 157-160, wherein said one or more optical elements configured to decrease the width of the output beam from the first transmission grating comprises an optical element oriented at an angle with respect to the light beam incident thereon to alter the beam size more in one direction than another.

162. The system of any of examples 157-161, wherein said one or more optical elements configured to decrease the width of the output beam from the first transmission grating is oriented at an angle with respect to the light beam incident thereon to reduce the beam size in a direction in the plane of incidence.

163. The system of any of examples 157-162, wherein said one or more optical elements configured to decrease the width of the output beam from the first transmission grating comprises a prism configured to provide anamorphic correction of the light beam incident thereon.

164. The system of any of examples 156-163, the system further comprising a third transmission grating configured to combine at least a fourth beam with the output beam from the first transmission grating.

165. A method of combining optical beams, the method comprising:

providing a transmission grating;

providing a first beam incident on the transmission grating at a first angle;

providing a second beam incident on the transmission grating at a second angle; and combining via the transmission grating the first and second beams as an output beam, wherein said first input beam is on an opposite sides of the output beam as the second input beam.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

What is claimed is:

1. A system of combining optical beams, the system comprising:

a first transmission grating optical beam combiner comprising:

a first optically transparent substrate; and a first transmission grating on the first substrate configured to combine first and second input beams into a single output beam, said first transmission grating configured such that when the first and second input beams are incident on the first transmission grating at first and second angles, respectively, the first and second beams are transmitted through the first transmission grating and diffracted into two different diffraction orders of the first transmission grating such that the first and second diffracted beams are directed towards the same direction, said first transmission grating comprising a surface grating;

a first laser configured to provide the first input beam incident on the first transmission grating;

a second laser configured to provide the second input beam incident on the first transmission grating, the system configured to provide the first beam incident on the first transmission grating at said first angle and configured to provide the second beam incident on the first transmission grating at said second angle such that the first transmission grating outputs a first combined beam at an angle not equal to the first incident angle and not equal to the second incident angle;

a second transmission grating optical beam combiner comprising:

a second optically transparent substrate; and a second transmission grating on the second substrate configured to combine third and fourth input beams into a single output beam, said second transmission grating configured such that when the third and fourth input beams are incident on the second transmission grating at third and fourth angles, respectively, the third and fourth beams are transmitted through the second transmission grating and diffracted into two different diffraction orders of the second transmission grating such that the third and fourth diffracted beams are directed towards the same direction, said second transmission grating comprising a surface grating;

a third laser configured to provide the third input beam incident on the second transmission grating;

a fourth laser configured to provide the fourth input beam incident on the second transmission grating, the system configured to provide the third beam incident on the second transmission grating at said third angle and configured to provide the fourth beam incident on the second transmission grating at said fourth angle such that the second transmission grating outputs a second combined beam at an angle not equal to the third incident angle and not equal to the fourth incident angle;

a third transmission grating optical beam combiner comprising:

a third optically transparent substrate; and a third transmission grating on the third substrate configured to combine said first and second combined input beams into a single output beam, said third transmission grating configured such that when the first and second combined beams are incident on the third transmission grating at fifth and sixth angles, respectively, the first and second combined beams are transmitted through the third transmission grating and diffracted into two different diffraction orders of the third transmission grating such that the first and second combined diffracted beams are directed towards the same direction, said third transmission grating comprising a surface grating; and one or more optical elements configured to decrease the width of the output beam from the second transmission grating.

2. The system of claim 1, wherein the diffraction orders comprise plus and minus diffraction orders.

3. The system of claim 1, wherein the diffraction orders comprise +1 and −1 diffraction orders.

4. The system of claim 1, wherein the third transmission grating outputs the output beam at an angle normal to the third transmission grating.

5. The system of claim 1, wherein the first transmission grating is configured to combine the first and second input beams as a single colinear output beam.

6. The system of claim 1, wherein the first transmission grating is formed in the first optically transparent substrate as part of a monolithic structure.

7. The system of claim 1, further comprising a multilayer stack.

8. The system of claim 1, further comprising a bulk window disposed with respect to the third transmission grating to increase the laser induced damage threshold of the third transmission grating, the bulk window comprising a material having a band gap that is from 5.0 eV to 10.0 eV.

9. The system of claim 1, wherein the first and second input beams are monochromatic.

10. The system of claim 1, wherein the first and second input beams have different spectral distributions.

11. The system of claim 1, wherein the first and second input beams have the same polarization.

12. The system of claim 1, wherein the first and second input beams have different polarizations.

13. The system of claim 1, further comprising one or more optical elements configured to decrease the width of the output beam from the first transmission grating.

14. The system of claim 13, wherein said one or more optical elements configured to decrease the width of the output beam from the first transmission grating comprise a prism configured to provide anamorphic correction of the light beam incident thereon.

15. The system of claim 1, wherein said first, second and third optically transparent substrates are selected from the group comprising fused silica, diamond, silicon nitride, aluminum oxide, aluminum nitride, and boron nitride.

16. The system of claim 1, wherein said first and second optically transparent substrates comprise prisms such that said first and second transmission gratings are on prisms.

17. The system of claim 1, wherein the first optically transparent substrate comprises fused silica.

18. A cascaded transmission grating optical beam combiner, comprising:

first and second optical elements, each comprising: a substrate and a transmission grating formed on a surface of the substrate, the transmission grating of the first optical element configured to diffract first and second input beams such that said first and second input beams are combined into a first combined output beam and the transmission grating of the second optical element configured to diffract third and fourth input beams such that said third and fourth input beams are combined into a second combined output beam;

a third optical element comprising a substrate and a transmission grating formed on a surface of the substrate, said third optical element arranged with respect to said first and second optical elements to receive said first combined output beam and said second combined output beam, said transmission grating of the third optical element configured to diffract and combine the first combined output beam and the second combined output beam into a third next-level combined output beam, first and second prisms positioned in the path of the first and second input beams, respectively, to decrease the width of the first and second input beams incident on the first optical element;

third and fourth prisms positioned in the path of the third and fourth input beams, respectively, to decrease the width of the third and fourth input beams incident on the second optical element; and fifth and sixth prisms positioned in the path of the first and second combined output beams, respectively, to decrease the width of the first and second combined output beams incident on the third optical element.

19. A method of combining optical beams, the method comprising:

providing a first transmission grating, said first transmission grating comprising a surface grating having a first grating spacing;

providing first and second input beams having different wavelengths incident on the first transmission grating at first and second angles, respectively;

transmitting the first and second beams having different wavelengths through the first transmission grating;

diffracting the first and second beams, said first grating spacing and said first and second angles being such that said first and second input beams having different wavelengths are incident into two different diffraction orders of the first transmission grating and the first and second diffracted beams having different wavelengths are directed towards the same direction, such that the first transmission grating outputs a first combined beam at an angle not equal to the first incident angle and not equal to the second incident angle;

decreasing the width of the first combined beam from the first transmission grating;

providing a second transmission grating, said second transmission grating comprising a surface grating having a second grating spacing;

providing third and fourth input beams having different wavelengths incident on the second transmission grating at third and fourth angles, respectively;

transmitting the third and fourth beams having different wavelengths through the second transmission grating;

diffracting the third and fourth beams, said second grating spacing and said third and fourth angles being such that said third and fourth input beams having different wavelengths are incident into two different diffraction orders of the second transmission grating and the third and fourth diffracted beams having different wavelengths are directed towards the same direction, such that the second transmission grating outputs a second combined beam at an angle not equal to the third incident angle and not equal to the fourth incident angle;

providing a third transmission grating, said third transmission grating comprising a surface grating having a third grating spacing;

transmitting the first and second combined beams through the third transmission grating; and diffracting the first and second combined beams, said third grating spacing and said first and second combined beams having angles such that said first and second combined beams are incident into two different diffraction orders of the third transmission grating and the first and second combined beams are directed towards the same direction, such that the third transmission grating outputs a third combined beam at an angle not equal to the angle of the first and second combined beams.

20. The method of claim 19, wherein the diffraction orders comprise +1 and −1 diffraction orders.

\* \* \* \* \*